(12) United States Patent
Dai

(10) Patent No.: US 11,522,167 B2
(45) Date of Patent: Dec. 6, 2022

(54) DISPLAY SUBSTRATE, DISPLAY APPARATUS, AND METHOD OF MANUFACTURING THEREOF

(71) Applicant: BOE TECHNOLOGY GROUP CO., LTD., Beijing (CN)

(72) Inventor: Qing Dai, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 1027 days.

(21) Appl. No.: 16/082,340

(22) PCT Filed: Mar. 26, 2018

(86) PCT No.: PCT/CN2018/080484
§ 371 (c)(1),
(2) Date: Sep. 5, 2018

(87) PCT Pub. No.: WO2019/041793
PCT Pub. Date: Mar. 7, 2019

(65) Prior Publication Data
US 2021/0202920 A1      Jul. 1, 2021

(30) Foreign Application Priority Data

Aug. 29, 2017   (CN) .......................... 201710755090.9

(51) Int. Cl.
*H01L 51/56*      (2006.01)
*H01L 51/52*      (2006.01)
*B05D 5/00*       (2006.01)

(52) U.S. Cl.
CPC .............. *H01L 51/56* (2013.01); *H01L 51/52* (2013.01); *B05D 5/00* (2013.01); *B05D 2401/10* (2013.01); *B05D 2401/31* (2013.01)

(58) Field of Classification Search
CPC .......... H01L 51/56; H01L 51/52; B05D 5/00; B05D 2401/10; B05D 2401/31
See application file for complete search history.

(56) References Cited

U.S. PATENT DOCUMENTS 4,553,153 A    11/1985  McColgin et al.
4,619,837 A *  10/1986  Brown .................. H01L 21/312
                                                   427/498
(Continued)

FOREIGN PATENT DOCUMENTS

CN    103700673 A    4/2014
CN    105607357 A    5/2016
(Continued)

OTHER PUBLICATIONS

Office Action dated Aug. 28, 2019, issued in counterpart CN Application No. 201710755090.9, with English translation (13 pages).

(Continued)

*Primary Examiner* — Robert S Walters, Jr.
(74) *Attorney, Agent, or Firm* — WHDA, LLP

(57) ABSTRACT

The present disclosure is related to a method of manufacturing a display substrate. The method may include forming a pattern layer (100, 200) on a base substrate (300) and forming a first planarization layer (500). The pattern layer (100, 200) may include at least one recess (105). Forming the first planarization layer (500) may include forming a pre-polymerized solution (501) at least in the recess (105) and polymerizing the pre-polymerized solution (501) in the recess (105) to form the first planarization layer (500).

13 Claims, 3 Drawing Sheets

(56) References Cited

U.S. PATENT DOCUMENTS

| | | | | |
|---|---|---|---|---|
| 5,358,740 | A | * | 10/1994 | Bornside ............. H01L 21/6715 118/52 |
| 5,654,202 | A | * | 8/1997 | Daly ..................... G03F 7/0007 257/E31.121 |
| 2010/0006843 | A1 | | 1/2010 | Lee et al. |
| 2013/0113086 | A1 | * | 5/2013 | Bai ..................... H01L 21/0212 257/632 |

FOREIGN PATENT DOCUMENTS

| | | | |
|---|---|---|---|
| CN | 105842990 | A | 8/2016 |
| JP | 2000-105548 | A | 4/2000 |
| JP | 2000-340796 | A | 12/2000 |
| JP | 2003-309269 | A | 10/2003 |
| JP | 2004-18668 | A | 1/2004 |
| JP | 2008-077912 | A | 4/2008 |
| JP | 2016-047898 | A | 4/2016 |
| KR | 20150011911 | A * | 2/2015 |
| KR | 10-2017-0026014 | A | 3/2017 |
| WO | 2016/046659 | A1 | 3/2016 |

OTHER PUBLICATIONS

Extended (Supplementary) European Search Report dated Mar. 25, 2021, issued in counterpart EP application No. 18785802.2. (8 pages).

Office Action dated Apr. 10, 2020, issued in counterpart CN application No. 201710755090.9, with English translation. (10 pages).

International Search Report dated Jun. 11, 2018, issued in counterpart International Application No. PCT/CN2018/080484. (10 pages).

Office Action dated Oct. 12, 2021, issued in counterpart JP application No. 2018-558407, with English translation. (8 pages).

* cited by examiner

DISPLAY SUBSTRATE, DISPLAY APPARATUS, AND METHOD OF MANUFACTURING THEREOF

CROSS-REFERENCE TO RELATED APPLICATIONS

This application claims benefit of the filing date of Chinese Patent Application No. 201710755090.9 filed on Aug. 29, 2017, the disclosure of which is hereby incorporated by reference.

TECHNICAL FIELD

This disclosure relates to display technology, and more particularly, to a display substrate, a display apparatus, and a method of manufacturing thereof.

BACKGROUND

An organic electronic thin film apparatus generally includes a transistor circuit, a light-emitting device (e.g., OLED), and a photo-sensing device. From a microscopic point of view, these components or devices are usually formed of multiple layers of inorganic (such as various metals, semiconductors, insulating media, etc.) and organic thin films. Furthermore, these films are patterned and can appear as linear, block, strip and so on. The patterned films overlap each other. However, different numbers of the film layers overlap in different regions, thereby causing a difference in the thickness of the film layers and an appearance of unevenness in different regions.

BRIEF SUMMARY

Accordingly, one example of the present disclosure is a method of manufacturing a display substrate. The method of manufacturing a display substrate may include forming a pattern layer on a base substrate and forming a first planarization layer. The pattern layer may include at least one recess. Forming the first planarization layer may include forming a pre-polymerized solution at least in the recess and polymerizing the pre-polymerized solution in the recess to form the first planarization layer.

In one embodiment, forming the pre-polymerized solution at least in the recess may include coating a first pre-polymerized solution on the pattern layer and receding the first pre-polymerized solution to the at least one recess. Receding the first pre-polymerized solution to the at least one recess may include partially evaporating the first pre-polymerized solution so that a liquid surface of the first pre-polymerized solution after evaporation is not substantially higher than an uppermost edge of the recess. A viscosity of the first pre-polymerized solution may be less than 50 centipoises. A volume of the first pre-polymerized solution after the evaporation may be 10 to 30% of a volume of the first pre-polymerized solution before the evaporation. A volume of the first pre-polymerized solution after the evaporation may be 30 to 50% of a volume of the recess. The first pre-polymerized solution may include a first monomer and an initiator and a mass concentration of the initiator in the first pre-polymerized solution after the evaporation may be less than or equal to 0.5 wt %. Polymerizing the pre-polymerized solution in the recess to form the first planarization layer may include polymerizing the first monomer of the first pre-polymerized solution under initiation of the initiator to form the first planarization layer.

Forming the pre-polymerized solution at least in the recess may further include coating a second pre-polymerized solution on the first pre-polymerized solution. An ultrasonic wave may be applied to the first pre-polymerized solution and the second pre-polymerized solution. The first pre-polymerized solution may include a first monomer, and the second pre-polymerized solution comprises a second monomer. The first pre-polymerized solution and/or the second pre-polymerized solution may include an optically active material. One of the first monomer and the second monomer may be an isocyanate-containing monomer and the other may be a hydroxyl-containing monomer. The first pre-polymerized solution may include an initiator, and a mass concentration of the initiator in the first pre-polymerized solution after the evaporation may be less than or equal to 0.5 wt %. The initiator may be an azo initiator or a peroxy initiator. Polymerizing the pre-polymerized solution in the recess to form the first planarization layer may include copolymerizing the first monomer of the first pre-polymerized solution and the second monomer of the second pre-polymerized solution to form the first planarization layer.

After forming the first planarization layer, the method may further include removing the first pre-polymerized solution and/or second pre-polymerized solution outside the recess. The method may also further include forming a second planarization layer on the first planarization layer.

Another example of the present disclosure may be a display panel manufactured by the method according to one embodiment of the present disclosure. Another embodiment of the present disclosure is a display apparatus comprising the display panel according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
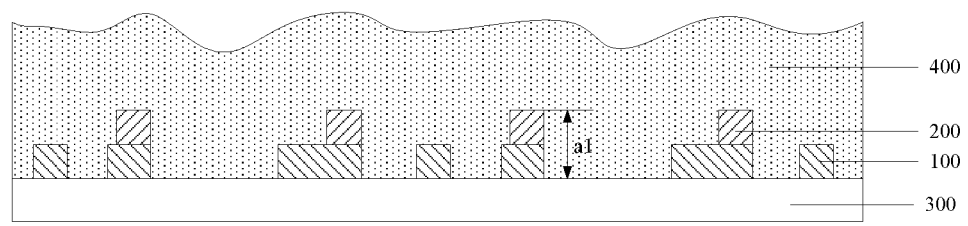
FIG. 1 is a schematic structural view of a conventional display substrate.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-4c. When referring to the figures, like structures and elements shown throughout are indicated with like reference numerals.

In this specification, numerical terms such as "first," "second," etc. may be added as prefixes. These prefixes, however, are only added in order to distinguish the terms and do not have specific meaning such as order and relative merits.

FIG. 1 is a schematic structural view of a related display substrate. As shown in FIG. 1, a first pattern layer 100 is disposed on a base substrate 300. A second pattern layer 200 is disposed on the first pattern layer 100. In FIG. 1, the highest point of the substrate is at the overlap of the two pattern layers, and the difference between the highest point of the substrate and the plane where the base substrate 300 is located is denoted as a1. After the fabrication of the circuit structure or the transistor device (i.e., the above pattern layer) is completed, a planarization layer 400 is formed to facilitate the subsequent process steps.

As shown in FIG. 1, when the step difference a1 of the pattern layer is too large, a single-layer photoresist coating can hardly satisfy the requirement of planarization. Alternatively, the photoresist must be thick enough to achieve a certain level of flatness, which would cause more difficulty for the subsequent process steps. For some functional devices such as organic electroluminescent devices (OLEDs), the thickness of the functional layer is usually thin, typically in the range of 20-100 nm, and accordingly the requirement for the surface flatness of the underlying substrate is very high. Surface unevenness of the substrate will be reflected in the light-emitting brightness, thereby resulting in uneven light emission.

One example of the present disclosure provides a method for manufacturing a display substrate. As shown in FIG. 2 and FIGS. 3a-3d, the method for manufacturing a display substrate includes the following steps:

In step 11, a pattern layer is formed on the base substrate 300. The pattern layer includes at least one recess 105.

In one embodiment, the pattern layer may include a first pattern layer 100 and a second pattern layer 200, and the first pattern layer 100 and the second pattern layer 200 are sequentially formed on the base substrate 300.

In step 12, a first planarization layer 500 is formed on the pattern layer. In one embodiment, a pre-polymerized solution is formed at least in the recess. The pre-polymerized solution in the recess is then polymerized to form the first planarization layer. The pre-polymerized solution is a polymerizable solution.

Figure 3A:
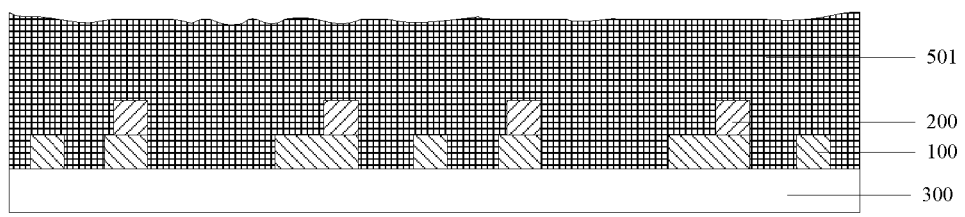
FIGS. 3a-3d show schematic diagrams of steps of manufacturing a first planarization layer of a display substrate according to one embodiment of the present disclosure.

In one embodiment, as shown in FIG. 3a, at least a first pre-polymerized solution 501 is coated on the pattern layer (i.e., the second pattern layer 200), and a polymer is formed by a polymerization reaction under heating to form the first planarization layer 500. In one embodiment, as shown in FIG. 3 a and FIG. 3c, a first pre-polymerized solution 501 and a second pre-polymerized solution 502 are sequentially coated on the pattern layer so that the first pre-polymerized solution 501 and the second pre-polymerized solution 502 are mixed. Step 12 may specifically include the following steps:

In step 121, a first pre-polymerized solution 501 is coated on the second pattern layer 200, as shown in FIG. 3a. Specifically, the first pre-polymerized solution 501 includes a first monomer used to generate the polymer.

Figure 3B:
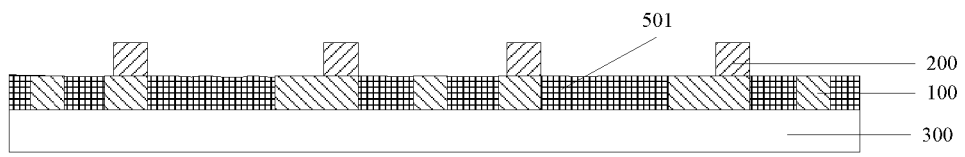
Figure 3C:
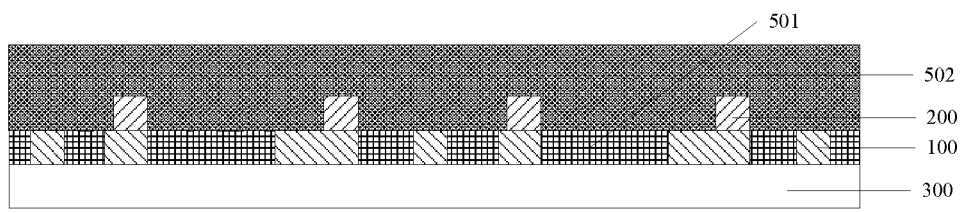

In step 122, a second pre-polymerized solution 502 is coated onto the first pre-polymerized solution 501, as shown in FIG. 3c. In one embodiment, after coating the second pre-polymerized solution 502, the second pre-polymerized solution 502 is mixed with the first pre-polymerized solution 501. In order to improve the mixing effect of the first pre-polymerized solution 501 and the second pre-polymerized solution 502, it is preferable that an ultrasonic wave is applied to the mixed solution during the mixing of the first pre-polymerized solution 501 and the second polymerization solution 502. In another embodiment, an ultrasonic wave is applied to the mixed solution of the first pre-polymerized solution 501 and the second pre-polymerized solution 502 during the polymerization reaction.

In one embodiment, since a photolithography process (e.g., exposure and development) needs to be applied on the planarization layer to form a pattern, the first pre-polymerized solution 501 and/or the second pre-polymerized solution 502 contain an optically active material. The optically active material may include an azidoquinone photosensitive group or a polycinnamic acid photosensitive group.

Figure 3D:
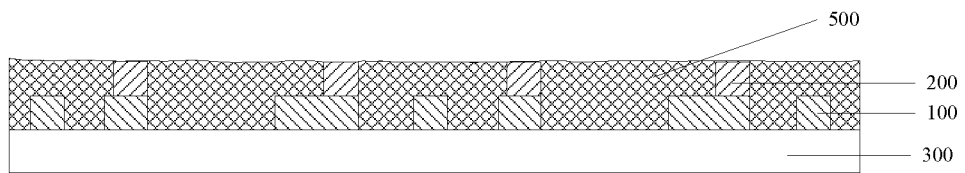

In Step 123, the polymer is formed by a polymerization reaction under heating so that the first planarization layer 500 is formed, as shown in FIG. 3d. Specifically, by controlling conditions such as time and temperature of the polymerization reaction, the degree of the polymerization can be controlled.

In one embodiment, the first pre-polymerized solution 501 and/or the second pre-polymerized solution 502 contains a catalyst or an initiator. The first monomer of the first pre-polymerized solution 501 and the second monomer of the second pre-polymerized solution 502 are copolymerized under the action of the catalyst or initiator to form a polymer that forms the first planarization layer 500. In one embodiment, one of the first monomer and the second monomer is an isocyanate-containing monomer and the other is a hydroxyl-containing monomer. In one embodiment, the initiator may be selected from azo initiators such as azobisisobutyronitrile or peroxy initiators such as dibenzoyl peroxide.

In one embodiment, before coating the second pre-polymerized solution 502 (ie, step 122), the method may further include the following steps:

In step 121, the first pre-polymerized solution 501 is partially evaporated so that the liquid level of the first pre-polymerized solution 501 after evaporation is lower than the top surface of the uppermost pattern layer (i.e., the second patterned layer 200). That is, the first pre-polymerized solution is receded to the recesses 105.

In one embodiment, as shown in FIG. 3b, after coating the first pre-polymerized solution 501, the first pre-polymerized solution 501 is partially evaporated before the second pre-polymerized solution 502 is applied. A portion of the solvent of the first pre-polymerized solution 501 can be removed by evaporation under reduced pressure. The first pre-polymerized solution 501 after evaporation flows into low-lying regions of the display substrate due to the self-leveling property. The low-lying regions are regions between different portions of the pattern layer. By first reducing the first pre-polymerized solution 501 by evaporation, the first pre-polymerized solution remains in the low-lying regions or recesses to polymerize "selectively" with the second pre-polymerized solution 502 to achieve the effect of pre-flattening.

In one embodiment, in order to ensure good leveling of the first pre-polymerized solution 501, the first pre-polymerized solution 501 can be kept at a low viscosity by selecting an appropriate solvent and controlling the concentration. Preferably, the viscosity of the first pre-polymerized solution 501 is less than 50 Centipoise, more preferably less than 40 Centipoise.

Depending on the evaporation rate of different types of solvents, the remaining amount of the first pre-polymerized solution 501 can be controlled by controlling the evaporation time. In one embodiment, the height of the liquid surface of the first pre-polymerized solution 501 after evaporation does not exceed the height of the pattern layer (i.e., the sum of the heights of the first pattern layer 100 and the second pattern layer 200) a1. Subsequently, the first pre-polymerized solution 501 will only participate in the polymerization reaction in the low-lying regions to initially reduce the step difference of different sections of the display substrate surface. In one embodiment, the volume of the first pre-polymerized solution 501 after evaporation is 10 to 30% of the volume of the first pre-polymerized solution before the evaporation.

By partially evaporating the first pre-polymerized solution 501, the self-leveling effect of the first pre-polymerized solution 501 is improved, so that the first pre-polymerized solution 501 can be uniformly distributed on the surface of the display substrate, and accordingly the planarization effect is better. This first pre-polymerized solution 501 can be applied onto the low-lying, rough interface of various complicated patterns. Moreover, the flow of the first pre-polymerized solution 501 is not limited by the shape of the patterns and thus has a wide scope of application. Moreover, it is also possible to control the remaining amount of the first pre-polymerized solution 501 by controlling the evaporation time so that the planarization effect of the first planarization layer 500 can be flexibly controlled.

In the case that the first pre-polymerized solution 501 contains a catalyst or an initiator, the concentration of the catalyst or the initiator tends to be very low. In one embodiment, after the solvent of the first pre-polymerized solution 501 is evaporated, the concentration of the catalyst or the initiator is less than or equal to 0.5 wt %.

In one embodiment, after forming the polymer (i.e., step 123), the method may further include the following steps:

In step 124, the unpolymerized or insufficiently polymerized first pre-polymerized solution 501 or second pre-polymerized solution 502 is removed. In one embodiment, after the polymerization reaction is completed, excess, insufficiently polymerized first pre-polymerized solution 501 or second pre-polymerized solution 502 outside the recesses 105 is removed by a solvent cleaning method to obtain the first planarization layer 500.

In step 13, a second planarization layer 600 is formed on the first planarization layer 500. In one embodiment, a second planarization layer material is coated on the formed first planarization layer 500 by spin-coating or a doctor blade coating, and then the second planarization layer 600 is obtained through processes such as cross-linking, curing, postbaking, and the like. The material of the second planarization layer may be the same as or different from the material of the polymerized first planarization layer, that is, the generated polymer.

It can be seen from the above steps 11-13, in one embodiment of the present disclosure, two planarization layers are formed at two times to obtain a display substrate comprising a two-stage planarization structure. After the first planarization layer 500 is formed, the step difference of different sections of the display substrate surface can be effectively reduced, thereby reducing the process difficulty when manufacturing the second planarization layer 600. In one embodiment, after the process of forming the two planarization layers, the maximum step difference of different sections of the display substrate surface can be effectively reduced to less than 20 nm, so as to ensure that the functional devices formed on the planarization layer work properly.

In one embodiment, the first monomer in the first pre-polymerized solution 501 may comprise a glycol such as ethylene glycol. The first pre-polymerized solution 501 contains a catalyst, which may be a Lewis acid such as aluminum chloride, tin chloride and the like. The second pre-polymerized solution 502 may comprise a dicarboxylic acid, a dibasic acid chloride, or the like, for example, terephthalic acid, terephthaloyl chloride, or the like. In one embodiment, the first pre-polymerized solution 501 and the second pre-polymerized solution 502 undergo a copolymerization reaction at a reaction temperature of 260-290° C. to form polyethylene terephthalate (commonly known as PET) with a degree of polymerization of 100-200.

Another example of the present disclosure provides a method for manufacturing a display substrate. The difference between the preparation method of Embodiment 2 and the preparation method of Embodiment 1 is that the first pre-polymerized solution 501 and the second pre-polymerized solution 502 in Embodiment 2 undergo a self-polymerization reaction.

In one embodiment, in step 123, the second pre-polymerized solution 502 may be an initiator. The first monomer of the first pre-polymerized solution 501 undergoes a self-polymerization reaction initiated by the second pre-polymerized solution 502 to generate the polymer. In another embodiment, the first pre-polymerized solution 501 may be an initiator and the second monomer of the second pre-polymerized solution 502 is self-polymerized under the initiation of the first pre-polymerized solution 501 to generate the polymer.

In one embodiment, the first pre-polymerized solution 501 includes an initiator. In step 121, the mass concentration of the initiator in the first pre-polymerized solution 501 after evaporation is less than or equal to 0.5%.

In one embodiment, the initiator is an azo initiator or a peroxy initiator. The pre-polymerized monomer that undergoes the self-polymerization may be styrene, methyl methacrylate or acrylonitrile.

The other steps in the preparation method in Embodiment 2 are the same as those in Embodiment 1, and the details are not described herein again.

In one embodiment, the first pre-polymerized solution 501 may be a toluene solution containing azobisisobutyronitrile or dibenzoyl peroxide as the initiator. The second pre-polymerized solution 502 may be selected from a toluene solution including styrene, methyl methacrylate or the like. In this case, the styrene monomer or the methyl methacrylate monomer in the second pre-polymerized solution 502 may undergo a self-polymerization reaction initiated by the first pre-polymerized solution 501, and the reaction temperature of the self-polymerization reaction is 40-80° C., to generate polystyrene (commonly known as PS) or polymethylmethacrylate (commonly known as PMMA). The molecular weight of the polymer can reach 100,000 to millions of orders of magnitude.

Another example of the present disclosure provides a method for manufacturing a display substrate. The difference between the preparation method of Embodiment 3 and the preparation methods of Embodiment 1 and Embodiment 2 is that in Embodiment 3, only the first pre-polymerized solution 501 is applied, i.e., the second pre-polymerized solution 502 is no longer applied. The first pre-polymerized solution 501 undergoes bulk polymerization.

Figure 4A:
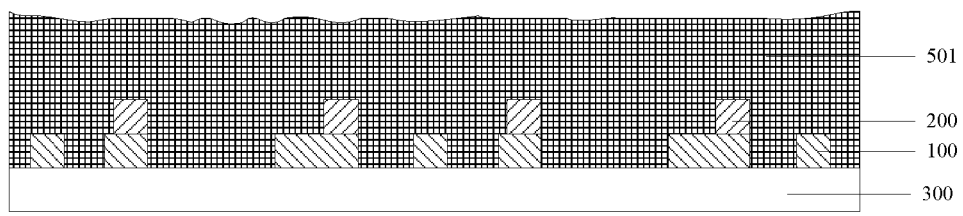
FIGS. 4a-4c show schematic diagrams of steps of manufacturing a first planarization layer of a display substrate according to one embodiment of the present disclosure.
Figure 4B:
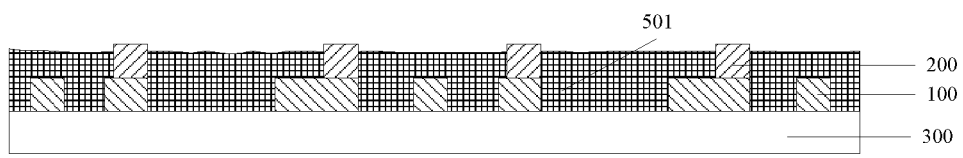

In one embodiment, as shown in FIGS. 4a and 4b, the step of manufacturing the first planarization layer specifically includes the following steps:

In step 21, a first pre-polymerized solution 501 is applied on the pattern layer (ie, the second pattern layer 200), as shown in FIG. 4a.

In one embodiment, the first pre-polymerized solution 501 is a solution of a first monomer, and the first pre-polymerized solution 501 contains an initiator. The first monomer may be styrene, methyl methacrylate, or acrylonitrile. The initiator can be an azo initiator or a peroxy initiator. The first pre-polymerized solution 501 may further contain an optically active material.

Figure 4C:
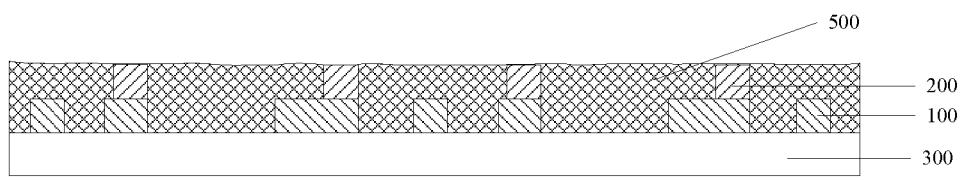

In step 22, under heating, the first monomer of the first pre-polymerized solution 501 undergoes bulk polymerization under the initiation of the initiator to form a polymer that forms the first planarization layer 500, as shown in FIG. 4c.

In one embodiment, before the bulk polymerization occurs (i.e., step 22), the method may further include the steps of:

In step 21, the first pre-polymerized solution 501 is partially evaporated so that the height of the liquid level of the first pre-polymerized solution 501 after evaporation is not higher than the upper surface of the uppermost pattern layer.

In one embodiment, as shown in FIG. 4b, after coating the first pre-polymerized solution 501, the first pre-polymerized solution 501 is partially evaporated before bulk polymerization occurs. A part of the solvent of the first pre-polymerized solution 501 can be removed by evaporation under reduced pressure. The evaporated first pre-polymerized solution 501 flows into the low-lying region of the display substrate due to the self-leveling property.

In one embodiment, in order to ensure good leveling of the first pre-polymerized solution 501, the first pre-polymerized solution 501 can be kept at a low viscosity by selecting the appropriate solvent and controlling the concentration. Preferably, the viscosity of the first pre-polymerized solution 501 is less than 50 Centipoise.

Depending on the evaporation rate of different types of solvent, the remaining amount of the first pre-polymerized solution 501 can be controlled by controlling the evaporation time. In one embodiment, the height of the liquid surface of the first pre-polymerized solution 501 after evaporation does not exceed the height of the pattern layer (i.e., the sum of the heights of the first pattern layer 100 and the second pattern layer 200) al. Subsequently, the first pre-polymerized solution 501 will only participate in the polymerization reaction in the low-lying regions to initially reduce the step difference of different sections of the display substrate surface. In one embodiment, the volume of the first pre-polymerized solution 501 after evaporation is 10 to 30% of the volume of the first pre-polymerized solution before the evaporation.

By partially evaporating the first pre-polymerized solution 501, the self-leveling effect of the first pre-polymerized solution 501 is improved, so that the first pre-polymerized solution 501 can be uniformly distributed on the surface of the display substrate, and accordingly the planarization effect is better. The first pre-polymerized solution can be applied to the low-lying, rough interface of various complicated patterns. Moreover, the flow of the first pre-polymerized solution 501 is not limited by the shape of the pattern and thus has a wide scope of application. Moreover, it is also possible to control the remaining amount of the first pre-polymerized solution 501 by controlling the evaporation time so that the planarization effect of the first planarization layer 500 can be flexibly controlled.

In one embodiment, after the solvent of the first pre-polymerized solution 501 is evaporated, the concentration of the initiator is less than or equal to 0.5 wt %.

In one embodiment, after the polymer is produced (i.e., step 22), the method may further include the step of removing the insufficiently polymerized first pre-polymerized solution 501.

In one embodiment, the first monomer in the first pre-polymerized solution 501 can be styrene, methylmethacrylate, vinyl acetate and the like. The initiator can be azobisisobutyronitrile or dibenzoyl peroxide. The first monomer in the first pre-polymerized solution 501 can undergo a bulk polymerization reaction initiated by the initiator, and the reaction temperature of the bulk polymerization reaction is 40-80° C. to form polystyrene (PS), PMMA or polyvinyl acetate (commonly known as PVAc). The molecular weight of the polymer may be between tens of thousands to hundreds of thousands of orders of magnitude.

Figure 2:
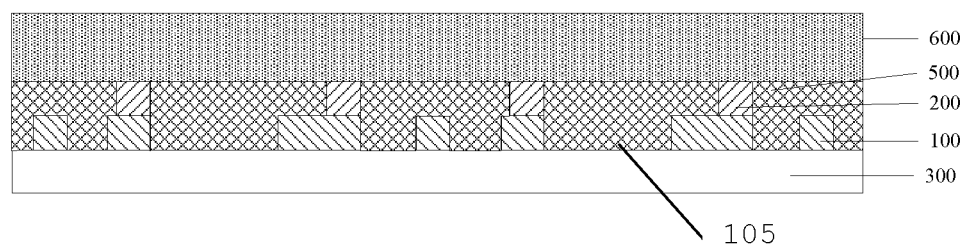
FIG. 2 is a schematic structural view of a display substrate according to one embodiment of the present disclosure.

Another example of the present disclosure provides a display substrate, which can be prepared by the method according to one embodiment of the present disclosure. In one embodiment, as shown in FIG. 2, the display substrate includes a base substrate 300, a pattern layer formed on the base substrate 300, a first planarization layer 500, and a second planarization layer 600. The first planarization layer 500 is formed on the pattern layer, and the second planarization layer 600 is formed on the first planarization layer 500.

In one embodiment, the material of the first planarization layer 500 and/or the second planarization layer 600 contains an optically active material.

In one embodiment of the present disclosure, two planarization layers are formed at two times respectively to obtain a display substrate comprising a two-stage planarization structure. After the first planarization layer 500 is formed, the step difference of different sections of the display substrate surface can be effectively reduced, thereby reducing the process difficulty when manufacturing the second planarization layer 600 and improving the planarization effect. In one embodiment, after the process of forming the two planarization layers, the maximum step difference among different sections of the display substrate surface can be effectively reduced to less than 20 nm, so as to ensure that the functional devices formed on the planarization layer work properly.

Another example of the present disclosure provides a display apparatus, which includes the display substrate according to one embodiment of the present disclosure.

In one embodiment, the surface of the display substrate is coated with at least one pre-polymerized solution with good self-leveling property. Excess solvent is removed by evaporation under reduced pressure. The remaining pre-polymerized solution remains only in the low-lying region of the display substrate and then polymerizes under certain external conditions. The polymer generated by the reaction is deposited in the low-lying region of the display substrate to form the first planarization layer, thereby reducing the initial sectional height difference. The second planarization layer is then formed on the first planarization layer using conventional methods to ultimately improve the flatness of the display substrate surface.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

DESCRIPTION OF SYMBOLS IN THE DRAWINGS

- 100: first pattern layer
- 200: second pattern layer
- 300: base substrate
- 400: planarization layer
- 500: first planarization layer
- 600: second planarization layer
- 501: first pre-polymerized solution
- 502: second pre-polymerized solution

What is claimed is:

1. A method of manufacturing a display substrate, comprising:
    forming a pattern layer on a base substrate, the pattern layer comprising at least one recess;
    coating a first pre-polymerized solution on the pattern layer;
    partially evaporating the first pre-polymerized solution under reduced pressure, wherein a liquid surface of the first pre-polymerized solution after the coating and before evaporation is higher than an uppermost edge of the at least one recess and the liquid surface of the first pre-polymerized solution after the evaporation is not higher than the uppermost edge of the at least one recess;
    polymerizing the pre-polymerized solution in the at least one recess to form a first planarization layer;
    wherein a volume of the first pre-polymerized solution after the evaporation is 30 to 50% of a volume of the at least one recess.

2. The method of claim 1, wherein a volume of the first pre-polymerized solution after the evaporation is 10 to 30% of a volume of the first pre-polymerized solution before the evaporation.

3. The method of claim 1, wherein the first pre-polymerized solution comprising a first monomer and an initiator and a mass concentration of the initiator in the first pre-polymerized solution after the evaporation is less than or equal to 0.5 wt %.

4. The method of claim 3, wherein polymerizing the pre-polymerized solution in the at least one recess to form the first planarization layer comprises polymerizing the first monomer of the first pre-polymerized solution under initiation of the initiator to form the first planarization layer.

5. The method of claim 1, further comprising:
    forming a second planarization layer on the first planarization layer.

6. A method of manufacturing a display substrate, comprising:
    forming a pattern layer on a base substrate, the pattern layer comprising at least one recess;
    coating a first pre-polymerized solution on the pattern layer;
    partially evaporating the first pre-polymerized solution, wherein a liquid surface of the first pre-polymerized solution after the coating and before evaporation is higher than an uppermost edge of the at least one recess and the liquid surface of the first pre-polymerized solution after the evaporation is not higher than the uppermost edge of the at least one recess;
    coating a second pre-polymerized solution on the first pre-polymerized solution before polymerizing the first pre-polymerized; and
    forming a first planarization layer;
    wherein the first pre-polymerized solution comprises a first monomer, and the second pre-polymerized solution comprises a second monomer; and
    one of the first monomer and the second monomer is an isocyanate-containing monomer and the other is a hydroxyl-containing monomer.

7. The method of claim 6, wherein an ultrasonic wave is applied to the first pre-polymerized solution and the second pre-polymerized solution.

8. The method of claim 6, wherein the first pre-polymerized solution and/or the second pre-polymerized solution comprises an optically active material.

9. The method of claim 6, wherein the first pre-polymerized solution comprises an initiator, a mass concentration of the initiator in the first pre-polymerized solution after the evaporation is less than or equal to 0.5 wt %.

10. The method of claim 6, wherein the initiator is an azo initiator or a peroxy initiator.

11. The method of claim 6, wherein forming the first planarization layer comprises:
    copolymerizing the first monomer of the first pre-polymerized solution and the second monomer of the second pre-polymerized solution to form the first planarization layer.

12. The method of claim 6, after forming the first planarization layer, the method further comprising:
    removing the first pre-polymerized solution and/or second pre-polymerized solution outside the at least one recess.

13. The method of claim 6, wherein partially evaporating the first pre-polymerized solution is performed under reduced pressure.

* * * * *